(12) United States Patent
Ha et al.

(10) Patent No.: US 7,683,389 B2
(45) Date of Patent: Mar. 23, 2010

(54) NITRIDE-BASED SEMICONDUCTOR LIGHT EMITTING DIODE

(75) Inventors: Moon Won Ha, Suwon (KR); Choi Chang Hwan, Seongnam (KR); Hwang Young Nam, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 311 days.

(21) Appl. No.: 11/797,491

(22) Filed: May 3, 2007

(65) Prior Publication Data
US 2007/0278499 A1    Dec. 6, 2007

(30) Foreign Application Priority Data
May 30, 2006    (KR) .................... 10-2006-0048877

(51) Int. Cl.
*H01L 29/20*    (2006.01)
(52) U.S. Cl. .................... 257/89; 257/94; 257/E33.014
(58) Field of Classification Search .................... 257/81, 257/85, 84, 93, 79, 94, 89
See application file for complete search history.

(56) References Cited
U.S. PATENT DOCUMENTS
6,593,597 B2    7/2003    Sheu
2005/0189552 A1*  9/2005    Ikoma et al. .................. 257/94

FOREIGN PATENT DOCUMENTS
JP    2002-185049    6/2002
KR    10-2004-0103134    12/2004

* cited by examiner

Primary Examiner—Jerome Jackson, Jr.
Assistant Examiner—Dale Page

(57) ABSTRACT

A nitride-based semiconductor LED comprises an anode; a first p-type clad layer having a second n-type clad layer coming in contact with the anode, the first p-type clad layer being formed under the anode such that a portion of the first p-type clad layer comes in contact with the anode; an active layer formed under the first p-type clad layer; a first n-type clad layer having a second p-type clad layer which does not come in contact with the active layer, the first n-type clad layer being formed on the entire lower surface of the active layer; and a cathode formed under the first n-type clad layer and the second p-type clad layer so as to come in contact with a portion of the first n-type clad layer and the second p-type clad layer.

4 Claims, 5 Drawing Sheets

[FIG. 1]
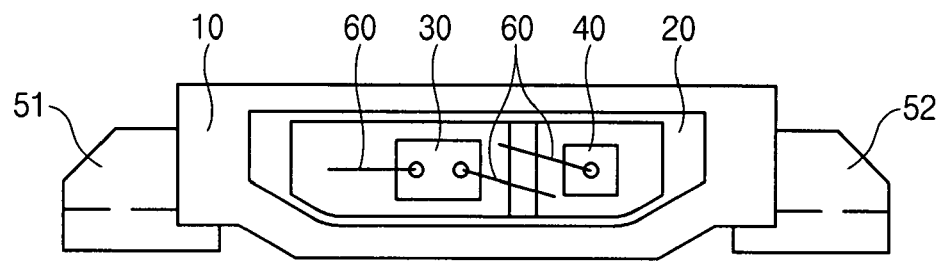
[FIG. 2]
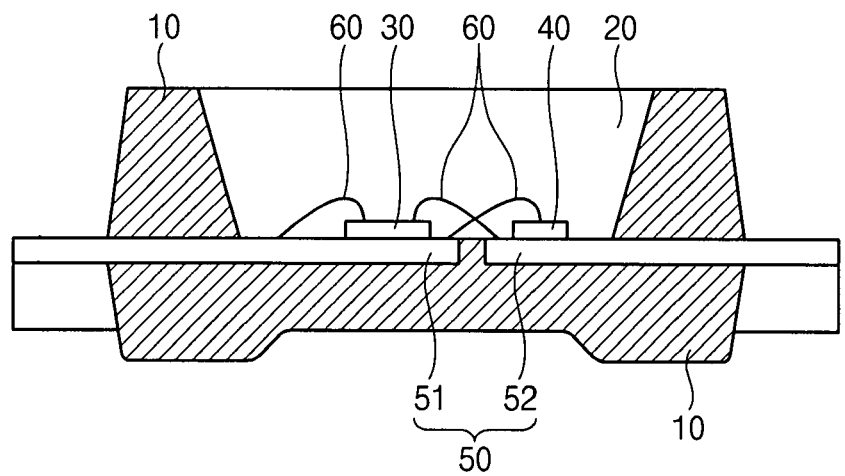
[FIG. 3]
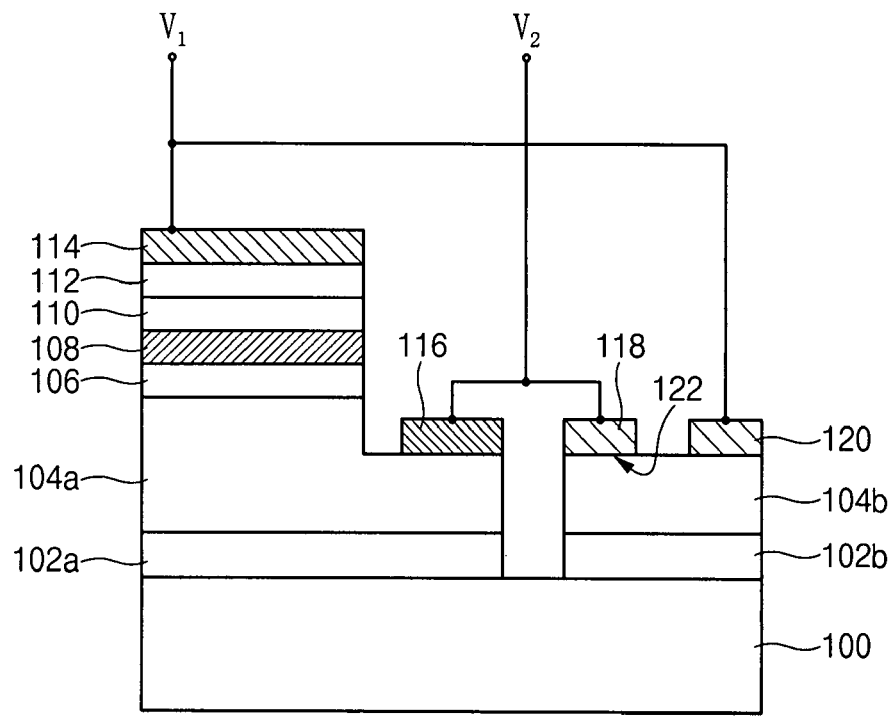

[FIG. 4]
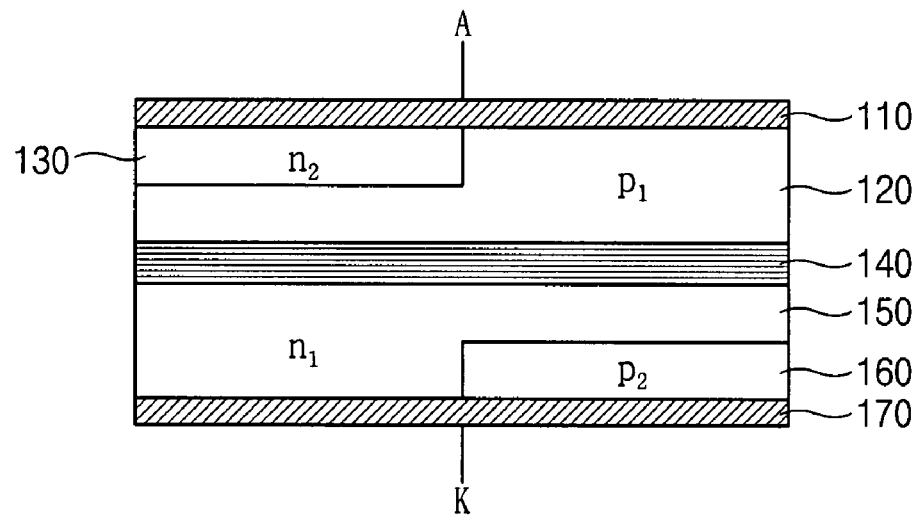
[FIG. 5]
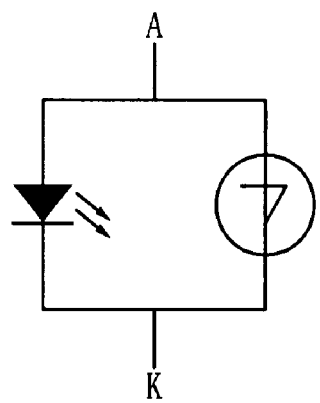
[FIG. 6]
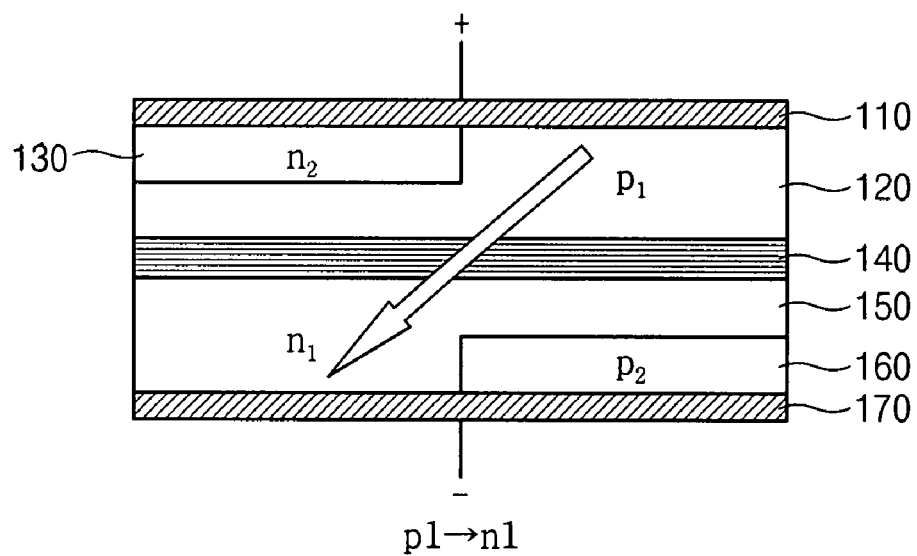
p1→n1

[FIG. 7]
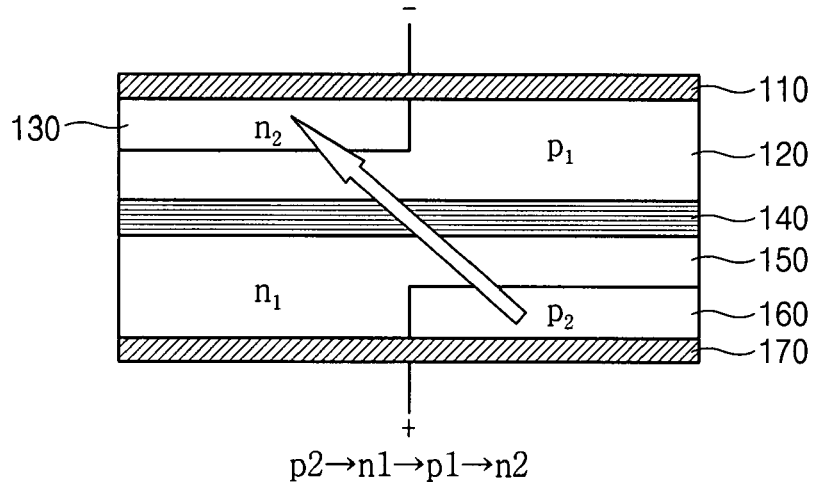
$p2 \rightarrow n1 \rightarrow p1 \rightarrow n2$
[FIG. 8]
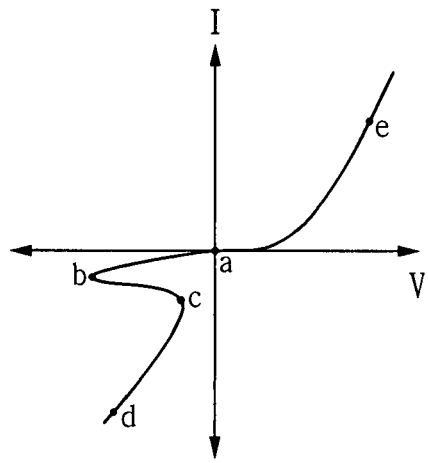
[FIG. 9]
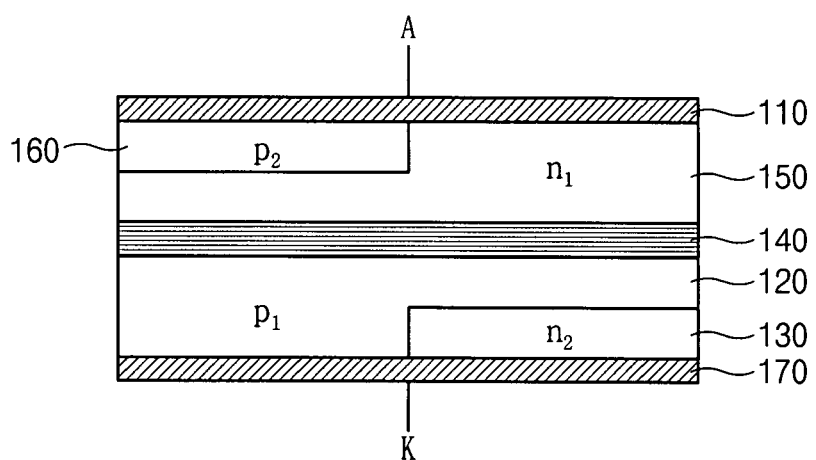

[FIG. 10]
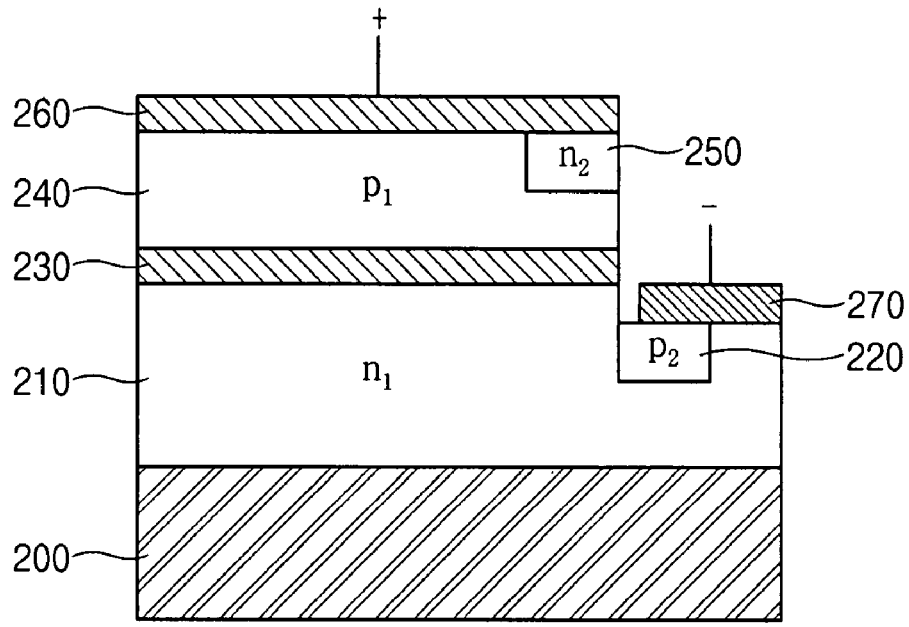
[FIG. 11]
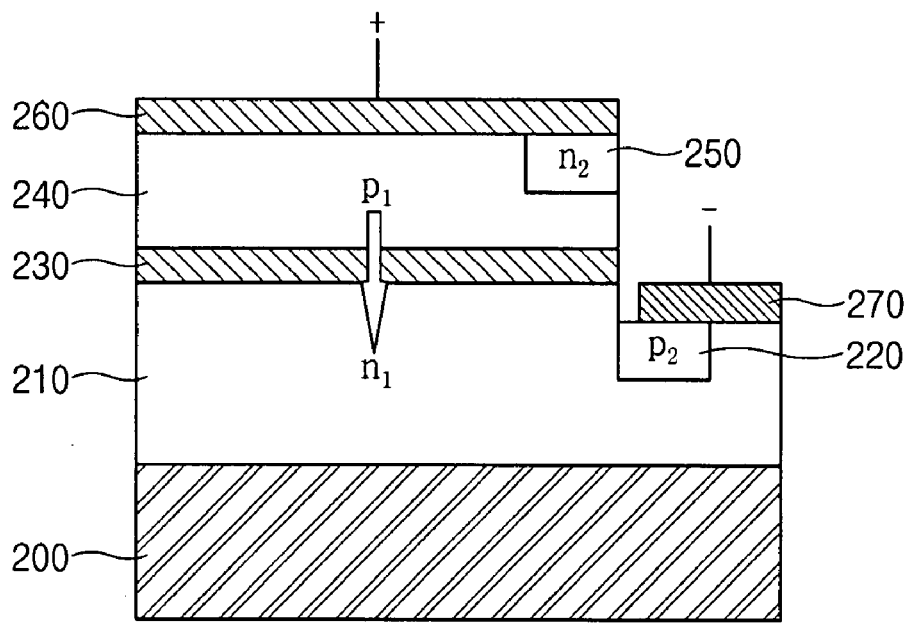
p1→n1

[FIG. 12]
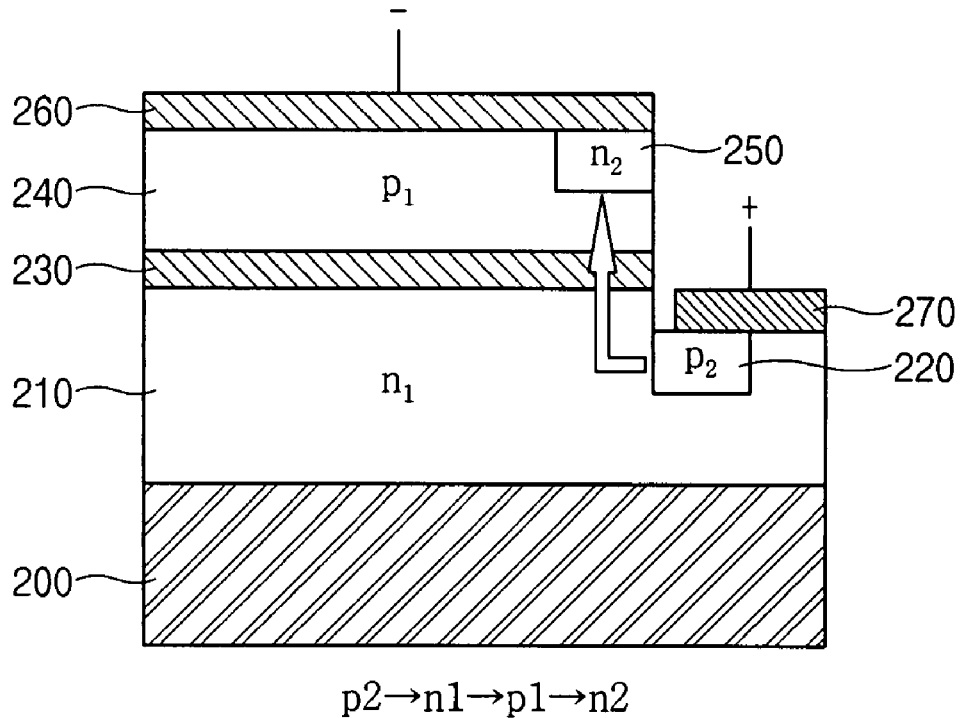
p2→n1→p1→n2
[FIG. 13]
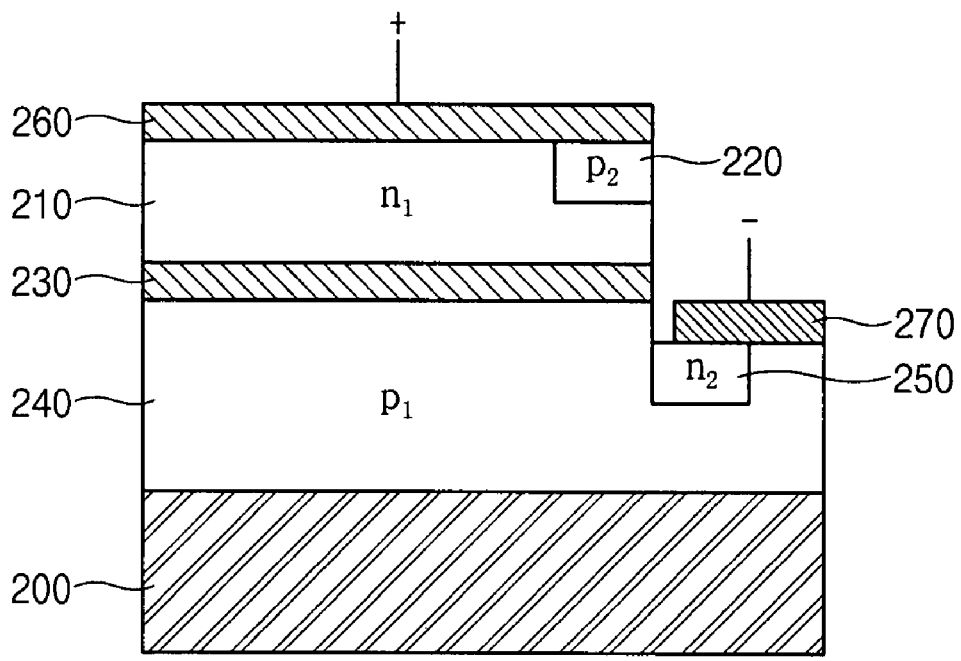

NITRIDE-BASED SEMICONDUCTOR LIGHT EMITTING DIODE

CROSS-REFERENCE TO RELATED APPLICATIONS

This application claims the benefit of Korean Patent Application No. 10-2006-0048877 filed with the Korean Intellectual Property Office on May 30, 2006, the disclosure of which is incorporated herein by reference.

BACKGROUND OF THE INVENTION

1. Field of the Invention

The present invention relates to a nitride-based semiconductor light emitting diode (LED) which has high resistance to electrostatic discharge (ESD).

2. Description of the Related Art

Because group III-V nitride semiconductors such as GaN have excellent physical and chemical properties, they are considered as essential materials of light emitting devices, for example, light emitting diodes (LEDs) or laser diode (LDs). The LEDs or LDs formed of the group III-V nitride semiconductors are widely used in the light emitting devices for obtaining blue or green light. The light emitting devices are applied to light sources of various products, such as electronic display boards and lighting devices.

However, the LEDs using nitride semiconductors have such a defect that they have much lower resistance to ESD than other compound semiconductors such as GaP and GaAlAs. For example, when a constant voltage of about several hundred volts (more than 100 V) is applied in a forward direction, the nitride semiconductor LED can be destroyed. Further, when a constant voltage of about dozen volts (more than 30 V) is applied in a backward direction, the nitride semiconductor LED can be destroyed. Such a constant voltage can be generated by static electricity which easily occurs in a person's body or a product when a nitride semiconductor light emitting devices such as an LED or LD is handled or used.

Accordingly, in order to suppress the damage of nitride semiconductor LEDs caused by ESD, various researches are being carried out. For example, a voltage regulator diode, in which an electric current can flow in a backward direction, is provided in order to make up for the weakness of nitride semiconductor LEDs with respect to ESD. As for the voltage regulator diode, a Zener Diode is provided, which is connected in parallel to an LED so as to effectively deal with static electricity.

Now, a conventional nitride-based semiconductor LED will be described in detail with reference to FIGS. 1 and 2.

FIG. 1 is a front view of a conventional nitride-based semiconductor LED, and FIG. 2 is a sectional view of the nitride-based semiconductor LED shown in FIG. 1.

As show in FIGS. 1 and 2, the nitride-based semiconductor LED includes an LED 30 and an ESD protecting element 40 which are mounted in parallel on the same surface of a lead frame 50 composed of a pair of anode lead 51 and cathode lead 52. The LED 30 and the ESD protecting element 40 are connected through a wire 60 formed of gold (Au), thereby forming a parallel structure. The ESD protecting element 40 is composed of a Zener diode.

In FIGS. 1 and 2, reference numeral 10 represents a package formed of transparent or opaque synthetic resin, and reference numeral 20 represents a molding material for protecting the LED.

The Zener diode serving as the ESD protecting element 40 is a so-called voltage regulator diode. The Zener diode is one of semiconductor p-n junction diodes and is manufactured so as to exhibit operational characteristics in a breakdown region of p-n junction. Further, the Zener diode obtains a constant voltage by using a Zener effect and operates in p-n junction of silicon at a current of 10 mA. Further, the Zener diode can obtain a constant voltage of 3 to 12 V, depending on a type thereof.

In the conventional nitride-based semiconductor LED, such a Zener diode is connected in parallel to the LED through a wire or the like. Therefore, although a backward current is applied due to static electricity, the Zener diode can prevent the LED from being damaged.

However, when the Zener diode and the LED is mounted in parallel on the lead frame, light emitted from the LED can be absorbed or diffused by the Zener diode, thereby reducing the luminance of the LED.

To solve such a problem, a technique in which an LED and a Schottky diode are formed on the same substrate has been proposed, as shown in FIG. 3B of U.S. Pat. No. 6,593,597. FIG. 3 is a sectional view illustrating the structure of a conventional nitride semiconductor LED shown in FIG. 3B of U.S. Pat. No. 6,593,597.

In the conventional nitride semiconductor LED shown in FIG. 3, an LED and a Schottky diode are formed on the same substrate so as to be connected in parallel to each other. Accordingly, light emitted from the LED is not lost, and the LED can be protected from ESD, thereby enhancing the luminance of the LED.

In such a technique, however, there is a problem that the manufacturing process thereof is complicated. That is, the LED region and the Schottky diode region should be separated from each other. Further, electrode materials forming Schottky contact and electrode materials forming ohmic contact should be separately deposited on a conductive buffer layer, in order to form Schottky junction.

SUMMARY OF THE INVENTION

An advantage of the present invention is that it provides a nitride-based semiconductor LED which has high resistance to ESD, without a separate element for enhancing resistance to ESD.

Additional aspect and advantages of the present general inventive concept will be set forth in part in the description which follows and, in part, will be obvious from the description, or may be learned by practice of the general inventive concept.

According to an aspect of the invention, a nitride-based semiconductor LED comprises an anode; a first p-type clad layer having a second n-type clad layer coming in contact with the anode, the first p-type clad layer being formed under the anode such that a portion of the first p-type clad layer comes in contact with the anode; an active layer formed under the first p-type clad layer; a first n-type clad layer having a second p-type clad layer which does not come in contact with the active layer, the first n-type clad layer being formed on the entire lower surface of the active layer; and a cathode formed under the first n-type clad layer and the second p-type clad layer so as to come in contact with a portion of the first n-type clad layer and the second p-type clad layer.

According to another aspect of the invention, a nitride-based semiconductor LED comprises an anode; a first n-type clad layer having a second p-type clad layer coming in contact with the anode, the first n-type clad layer being formed under the anode such that a portion of the first n-type clad layer comes in contact with the anode; an active layer formed under the first n-type clad layer; a first p-type clad layer having a second n-type clad layer which does not come in contact with the active layer, the first p-type clad layer being formed on the entire lower surface of the active layer; and a cathode formed under the first p-type clad layer and the second n-type clad layer so as to come in contact with a portion of the first p-type clad layer and the second n-type clad layer.

According to a further aspect of the invention, a nitride-based semiconductor LED comprises a substrate; a first n-type clad layer having a second clad p-type layer which does not come in contact with the substrate, the first n-type clad layer being formed on the entire upper surface of the substrate; an active layer formed on a predetermined region of the first n-type clad layer; a first p-type clad layer having a second n-type clad layer which does not come in contact with the active layer, the first p-type clad layer being formed on the entire upper surface of the active layer; an anode formed on a portion of the first p-type clad layer and the second n-type clad layer; and a cathode formed on a portion of the first n-type clad layer and the second p-type clad layer where the active layer is not formed.

According to a still further aspect of the invention, a nitride-based semiconductor LED comprises a substrate; a first p-type clad layer having a second n-type clad layer which does not come in contact with the substrate; the first p-type clad layer being formed on the entire upper surface of the substrate; an active layer formed on a predetermined region of the first p-type clad layer; a first n-type clad layer having a second p-type clad layer which does not come in contact with the active layer, the first n-type clad layer being formed on the entire upper surface of the active layer; an anode formed on a portion of the first n-type clad layer and the second p-type clad layer; and a cathode formed on a portion of the first p-type clad layer and the second n-type clad layer where the active layer is not formed.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a front view of a conventional nitride-based semiconductor LED;

FIG. 2 is a sectional view of the nitride-based semiconductor LED shown in FIG. 1;

FIG. 3 is a sectional view illustrating the structure of a conventional nitride semiconductor LED shown in FIG. 3B of U.S. Pat. No. 6,593,597;

FIG. 4 is a sectional view illustrating the structure of a nitride-based semiconductor LED according to a first embodiment of the invention;

FIG. 5 is a circuit diagram of the nitride-based semiconductor LED shown in FIG. 4;

FIGS. 6 and 7 are sectional views illustrating forward and backward current flows of the nitride-based semiconductor LED shown in FIG. 4;

FIG. 8 is a graph showing an I-V curve of the nitride-based semiconductor LED shown in FIG. 4;

FIG. 9 is a sectional view illustrating the structure of a nitride-based semiconductor LED according to a second embodiment of the invention;

FIG. 10 is a sectional view illustrating the structure of a nitride-based semiconductor LED according to a third embodiment of the invention;

FIGS. 11 and 12 are sectional views showing forward and backward current flows of the nitride-based semiconductor LED shown in FIG. 10; and FIG. 13 is a sectional view of a nitride-based semiconductor LED according to a fourth embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, a nitride-based semiconductor LED according to the present invention will be described in detail with reference to the accompanying drawings.

First Embodiment

Referring to FIGS. 4 and 5, the structure of a nitride-based semiconductor LED according to a first embodiment of the invention will be described in detail.

FIG. 4 is a sectional view illustrating the structure of the nitride-based semiconductor LED according to the first embodiment of the invention, and FIG. 5 is a circuit diagram of the nitride-based semiconductor LED shown in FIG. 4.

As shown in FIG. 4, the nitride-based semiconductor LED has an anode 110 formed in the uppermost portion thereof, the anode 110 being composed of Cr/Au or the like.

Under the anode 110, a first p-type clad layer 120 is formed. The first p-type clad layer 120 includes a second n-type clad layer 130 formed in a predetermined region thereof, and the second n-type clad layer 130 is formed to come in contact with the anode 110. Preferably, the first p-type clad layer 120 and the second n-type clad layer 130 are formed of a group III-V semiconductor, ZnO, a II-VI compound semiconductor, Si and the like, which include $In_XAl_YGa_{(1-X-Y)}N$ compositions ($0 \leq X \leq 1$, $0 \leq Y \leq 1$, $0 \leq X+Y \leq 1$).

That is, the anode 110 is formed to simultaneously come in contact with the first p-type clad layer 120 and the second n-type clad layer 130.

Under the first p-type clad layer 120 having the second n-type clad layer 130, an active layer 140 is formed. The active layer 140 is formed to have a multi-quantum well structure composed of an InGaN/GaN layer.

The active layer 140 may be formed with a single-quantum well structure or a double-hetero structure.

Under the active layer 140, a first n-type clad layer 150 is formed. The first n-type clad layer 150 also has a second p-type clad layer 160 formed in a predetermined region thereof, similar to the first p-type clad layer 120. The second p-type clad layer 160 is formed so as not to come in contact with the active layer 140. Preferably, the first n-type clad layer 150 and the second p-type clad layer 160 are formed of a group II-V semiconductor, ZnO, a II-VI compound semiconductor, Si and the like, which include $In_XAl_YGa_{(1-X-Y)}N$ compositions ($0 \leq X \leq 1$, $0 \leq Y \leq 1$, $0 \leq X+Y \leq 1$).

Under a portion of the first n-type clad layer 150 and the second p-type clad layer 160, a cathode 170 is formed so as to simultaneously come in contact with the first n-type clad layer 150 and the second p-type clad layer 160. Therefore, it is possible to reduce the number of electrodes to be formed, compared with the conventional nitride-based semiconductor LED disclosed in FIG. 3B of U.S. Pat. No. 6,593,597 in which an LED and a Schottky diode are formed on the same substrate. As a result, it is possible to simplify a manufacturing process.

When the above-described nitride-based semiconductor LED according to the first embodiment of the invention is forward biased, it acts as a p-n diode like an LED. Further, when the nitride-based semiconductor LED is backward biased, it acts as a Shockley diode having a p-n-p-n structure.

That is, the nitride-based semiconductor LED has a structure in which a p-n diode 300 and a Shockley diode 400 are connected in parallel as shown in FIG. 5.

Hereinafter, an operation method of the nitride-based semiconductor LED according to the first embodiment will be described with reference to FIGS. 6 to 8.

FIGS. 6 and 7 are sectional views illustrating forward and backward current flows of the nitride-based semiconductor LED shown in FIG. 4, and FIG. 8 is a graph showing an I-V curve of the nitride-based semiconductor LED shown in FIG. 4.

First, when the nitride-based semiconductor LED according to the first embodiment is forward biased, an electric current flow in a direction ($p_1 \rightarrow n_1$) indicated by an arrow of FIG. 6 such that the nitride-based semiconductor LED acts as a p-n diode. In FIG. 8, the I-V curve forms a curve with apex a→e ($p_1 \rightarrow n_1$), which means that the nitride-based semiconductor LED normally acts.

Meanwhile, when the nitride-based semiconductor LED according to the first embodiment is backward biased, an electric current flow in a direction ($p_2 \rightarrow n_1 \rightarrow p_1 \rightarrow n_2$) indicated by an arrow of FIG. 7 such that the nitride-based semiconductor LED acts as a Shockley diode having a p-n-p-n structure. Therefore, the electric current is by-passed through the Shockley diode such that damage caused by ESD can be prevented.

Particularly, when the nitride-based semiconductor LED according to the first embodiment is backward biased, the I-V curve forms a curve with apex a→b→c→d ($p_2 \rightarrow n_1 \rightarrow p_1 \rightarrow n_2$), as shown in FIG. 8. Therefore, even when the nitride-based semiconductor LED is backward biased as well as when the nitride-based semiconductor LED is forward biased, it can normally act.

In other words, the nitride-based semiconductor LED according to the first embodiment of the invention can operate even in an alternating current mode, that is, in both forward and backward biases.

Second Embodiment

Now, a nitride-based semiconductor LED according to a second embodiment of the invention will be described with reference to FIG. 9. However, the descriptions of the same components as those of the first embodiment will be omitted.

FIG. 9 is a sectional view illustrating the structure of the nitride-based semiconductor LED according to the second embodiment of the invention.

As shown in FIG. 9, the nitride-based semiconductor LED according to the second embodiment has almost the same construction as the nitride-based semiconductor LED according to the first embodiment. In the second embodiment, however, a first n-type clad layer 150 including a second p-type clad layer 160 is formed under the anode 110, and a first p-type clad layer 120 including a second n-type clad layer 130 is formed under the active layer 140, while in the first embodiment, the first p-type clad layer 120 including the second n-type clad layer 130 is formed under the anode 110 and the first n-type clad layer 150 including the second p-type clad layer 160 is formed under the active layer 140.

That is, the first embodiment shows a Shockley diode having a p-n-p-n structure, and the second embodiment shows a Shockley diode having an n-p-n-p structure.

Therefore, in the second embodiment, the p-n diode and the Shockley diode are also connected in parallel, similar to the first embodiment. Accordingly, the nitride-based semiconductor LED according to the second embodiment has high resistance to ESD, and simultaneously, can be operate in both forward and backward biases.

Third Embodiment

Now, a nitride-based semiconductor LED according to a third embodiment of the invention will be described in detail with reference to FIG. 10. However, the descriptions of the same components as those of the first embodiment will be omitted.

FIG. 10 is a sectional view of the nitride-based semiconductor LED according to the third embodiment of the invention.

As shown in FIG. 10, the nitride-based semiconductor LED has a substrate 200 formed in the lowermost portion thereof. The substrate 200, which is a substrate suitable for growing nitride semiconductor single crystal, may be a heterogeneous substrate, such as a sapphire substrate or silicon carbide (SiC) substrate, or a homogeneous substrate such as a nitride substrate.

On the substrate 200, a first n-type clad layer 210 is formed, the first n-type clad layer 210 including a second p-type clad layer 220 which does not come in contact with the substrate 200.

On a predetermined region of the first n-type clad layer 210, an active layer 230 is formed.

On the entire surface of the active layer 230, a first p-type clad layer 240 is formed, the first p-type clad layer 240 including a second n-type clad layer 250 which does not come in contact with the active layer 230. On the first p-type clad layer 240 and the second n-type clad layer 250, an anode 260 is positioned so as to simultaneously come in contact with a portion of the first p-type clad layer 240 and the second n-type clad layer 250.

On the first n-type clad layer 210 where the active layer 230 is not formed, that is, on a portion of the first n-type clad layer 210 and the second p-type clad layer 220, which are exposed by mesa-etching portions of the active layer 230 and the first p-type clad layer 240, a cathode 270 is formed so as to simultaneously come in contact with the first n-type clad layer 210 and the second p-type clad layer 220.

Now, an operation method of the nitride-based semiconductor LED according to the third embodiment of the invention will be described with reference to FIGS. 11 and 12.

FIGS. 11 and 12 are sectional views showing forward and backward current flows of the nitride-based semiconductor LED shown in FIG. 10.

When the nitride-based semiconductor LED according to the third embodiment is forward biased, an electric current flow in a direction ($p_1 \rightarrow n_1$) indicated by an arrow of FIG. 11 such that the nitride-based semiconductor LED acts as a p-n diode.

Meanwhile, when the nitride-based semiconductor LED according to the third embodiment is backward biased, an electric current flow in a direction ($p_2 \rightarrow n_1 \rightarrow p_1 \rightarrow n_2$) indicated by an arrow of FIG. 12 such that the nitride-based semiconductor LED acts as a Shockley diode having a p-n- p-n structure. Therefore, an electric current is by-passed through the Shockley diode such that damage caused by ESD can be prevented.

That is, the first embodiment exemplifies a vertical LED in which different electrodes are formed vertically, and the third embodiment exemplifies a lateral LED in which different electrodes are formed laterally.

Therefore, the third embodiment has the same operation and effect as the first embodiment.

Fourth Embodiment

Now, a nitride semiconductor LED according to a fourth embodiment of the invention will be described with reference to FIG. 13. However, the descriptions of the same components as those of the third embodiment will be omitted.

FIG. 13 is a sectional view of the nitride-based semiconductor LED according to the fourth embodiment of the invention.

As shown in FIG. 13, the nitride-based semiconductor LED according to the fourth embodiment has almost the same construction as the nitride-based semiconductor LED according to the third embodiment. In the second embodiment, however, a first p-type clad layer 250 including a second n-type clad layer 240 is formed on the substrate 200, and a first n-type clad layer 210 including a second p-type clad layer 220 is formed on the active layer 230, while in the third embodiment, the first n-type clad layer 210 including the second p-type clad layer 220 is formed on the substrate 200 and the first p-type clad layer 240 including the second p-type clad layer 250 is formed on the active layer 230.

That is, the third embodiment shows a Shockley diode with a p-n-p-n structure, and the fourth embodiment shows a Shockley diode with an n-p-n-p structure.

Therefore, in the fourth embodiment, the p-n diode and the Shockley diode are also connected in parallel, similar to the third embodiment. Accordingly, the nitride-based semiconductor LED according to the fourth embodiment has high resistance to ESD, and simultaneously, can operate in both forward and backward biases.

According to the present invention, when a forward bias is applied, the nitride-based semiconductor LED acts as a p-n diode. Further, when a backward bias is applied, the nitride-based semiconductor LED acts as a Shockley diode with a p-n-p-n structure. As such, the nitride-based semiconductor LED, which operates in both forward and backward biases, has high resistance to ESD.

Further, in the invention, a separate element for enhancing resistance to ESD does not need to be provided so that a spatial margin is secured. Therefore, the nitride-based semiconductor LED can be reduced in size, and simultaneously, a light-emission area is increased, thereby enhancing a luminance characteristic.

Further, the number of electrodes is reduced so that the overall manufacturing process can be simplified. Therefore, it is possible to increase a production yield of nitride-based semiconductor LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A nitride-based semiconductor LED comprising:
an anode composed of metal;
a second n-type clad layer formed on a lower surface of the anode to come in contact with the anode;
a first p-type clad layer being formed on a lower surface of the anode and a lower surface of the second n-type clad layer to come in contact with the anode and the second n-type clad layer;
an active layer formed on a lower surface of the first p-type clad layer;
a first n-type clad layer formed on an entire lower surface of the active layer;
a second p-type clad layer formed on a lower surface of the first n-type clad layer such that the second p-type clad layer does not come in contact with the active layer entirely; and
a cathode formed on a lower surface of the first n-type clad layer and a lower surface of the second p-type clad layer to come in contact with the first n-type clad layer and the second p-type clad layer, the cathode being composed of metal.

2. A nitride-based semiconductor LED comprising:
an anode composed of metal;
a second p-type clad layer formed on a lower surface of the anode to come in contact with the anode;
a first n-type clad layer formed on a lower surface of the anode and a lower surface of the second p-type clad layer to come in contact with the anode and the second n-type clad layer;
an active layer formed on a lower surface of the first n-type clad layer;
a first p-type clad layer formed on an entire lower surface of the active layer;
a second n-type clad layer formed on a lower surface of the first p-type clad layer such that the second n-type clad layer does not come in contact with the active layer entirely; and
a cathode formed on a lower surface of the first p-type clad layer and a lower surface of the second n-type clad layer to come in contact with the first p-type clad layer and the second n-type clad layer, the cathode being composed of metal.

3. A nitride-based semiconductor LED comprising:
a substrate;
a first n-type clad layer formed on an entire upper surface of the substrate;
a second p-type clad layer formed on an upper surface on the first n-type clad layer such that the second p-type clad layer does not come in contact with the substrate;
an active layer formed on a predetermined region of an upper surface of the first n-type clad layer;
a first p-type clad layer formed on an entire upper surface of the active layer;
a second n-type clad layer formed on an upper surface of the first p-type clad layer such that the second n-type clad layer does not come in contact with the active layer entirely;
an anode formed on an upper surface of the first p-type clad layer and an upper surface of the second n-type clad layer to come in contact with the first p-type clad layer and the second n-type clad layer, the anode being composed of metal; and
a cathode formed on a partial upper surface of the first n-type clad layer and an upper surface of the second p-type clad layer where the active layer is not formed to come in contact with the first n-type clad layer and the second p-type clad layer, the cathode being composed of metal.

4. A nitride-based semiconductor LED comprising:

a substrate;

a first p-type clad layer formed on an entire upper surface of the substrate;

a second n-type clad layer on an upper surface of the first p-type clad layer such that the second n-type clad layer does not come in contact with the substrate;

an active layer formed on a predetermined region of an upper surface of the first p-type clad layer;

a first n-type clad layer formed on an entire upper surface of the active layer;

a second p-type clad layer formed on an upper surface of the first n-type clad layer such that the second p-type clad layer does not come in contact with the active layer entirely;

an anode formed on an upper surface of the first n-type clad layer and an upper surface of the second p-type clad layer to come in contact with the first n-type clad layer and the second p-type clad layer, the anode being composed of metal; and a cathode formed on a partial upper surface of the first p-type clad layer and an upper surface of the second n-type clad layer where the active layer is not formed to come in contact with the first p-type clad layer and the second n-type clad layer, the cathode being composed of metal.

* * * * *